US012749656B2

(12) United States Patent
Kim et al.

(10) Patent No.: US 12,749,656 B2
(45) Date of Patent: Sep. 29, 2026

(54) SUBSTRATE PROCESSING DEVICE AND SUBSTRATE PROCESSING METHOD

(71) Applicant: SEMES CO., LTD., Cheonan-si (KR)

(72) Inventors: Tae Sung Kim, Siheung-si (KR); Duk Hyun Son, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 192 days.

(21) Appl. No.: 18/387,655

(22) Filed: Nov. 7, 2023

(65) Prior Publication Data

US 2024/0203696 A1 Jun. 20, 2024

(30) Foreign Application Priority Data

Dec. 20, 2022 (KR) ........................ 10-2022-0179165
Mar. 6, 2023 (KR) ........................ 10-2023-0029428

(51) Int. Cl.

*H01J 37/32* (2006.01)
*H10P 50/24* (2026.01)
*H10P 50/26* (2026.01)

(52) U.S. Cl.

CPC .... *H01J 37/32449* (2013.01); *H01J 37/3244* (2013.01); *H10P 50/242* (2026.01); *H10P 50/267* (2026.01); *H01J 2237/334* (2013.01)

(58) Field of Classification Search

None
See application file for complete search history.

(56) References Cited

U.S. PATENT DOCUMENTS

2015/0228460 A1* 8/2015 Mizutani ........... H01L 21/31138
156/345.24
2020/0035503 A1* 1/2020 Tabata .................. H01L 21/022

FOREIGN PATENT DOCUMENTS

| | | | |
|---|---|---|---|
| KR | 10-1736841 | B1 | 5/2017 |
| KR | 10-2017-0063943 | A | 6/2017 |
| KR | 1020190048531 | A | 5/2019 |
| KR | 10-2062596 | B1 | 12/2019 |
| WO | 2013/049511 | A2 | 4/2013 |
| WO | 2013/109427 | A1 | 7/2013 |
| WO | 2016/053567 | A1 | 4/2016 |

OTHER PUBLICATIONS

Korean Office Action issued in corresponding KR Patent Application No. 10-2023-0029428, dated May 14, 2026, with English translation.

* cited by examiner

*Primary Examiner* — Jiong-Ping Lu
(74) *Attorney, Agent, or Firm* — Carter, DeLuca & Farrell LLP

(57) ABSTRACT

The substrate processing device includes a chamber in which a processing space for processing a substrate is formed, a substrate support unit supporting the substrate in the processing space, a gas supply portion supplying process gas to the processing space, a gas supply unit supplying gas to the gas supply portion, and a controller connected to the gas supply unit, wherein the gas supply unit includes a flow control valve controlling a flow rate of the process gas supplied through a gas supply line, and the controller controls, during a first time, the flow control valve to alternately provide supply of a flow rate greater than an average flow rate for the first time and supply of a flow rate less than the average flow rate.

8 Claims, 11 Drawing Sheets

SUBSTRATE PROCESSING DEVICE AND SUBSTRATE PROCESSING METHOD

CROSS-REFERENCE TO RELATED APPLICATION (S)

This application claims benefit of priority to Korean Patent Application Nos. 10-2022-0179165 filed on Dec. 20, 2022 and 10-2023-0029428 filed on Mar. 6, 2023 in the Korean Intellectual Property Office, the disclosures of which are incorporated herein by reference in their entireties.

BACKGROUND

1. Field

The present disclosure relates to a substrate processing device and method, and more particularly, to a substrate processing device and method using plasma.

2. Description of Related Art

To manufacture semiconductor devices, various processes, such as photolithography, etching, ashing, ion implantation, thin film deposition, and cleaning, are performed on a substrate to form a desired pattern on the substrate. Thereamong, the etching process is a process of removing a selected heating region of a film formed on the substrate, and wet etching and dry etching are used.

An etching device using plasma is used for dry etching. Generally, to form plasma, an electromagnetic field is formed in an internal space of a chamber, and the electromagnetic field excites a process gas provided in the chamber into a plasma state.

Plasma refers to an ionized gas state including ions, electrons, radicals, etc. Plasma is generated by very high temperatures, strong electric fields, or RF electromagnetic fields. The semiconductor device manufacturing process uses plasma to perform an etching process. The etching process is performed as ion particles contained in plasma collide with the substrate.

A process gas is supplied to the chamber. Controlling the supply of the process gas for each region has been disclosed in technology, such as Patent Document 1, but there is a limitation in that the technology is slightly insufficient to control the uniformity of the plasma.

(Patent Document 1) KR 10-1736841 B

SUMMARY

An aspect of the present disclosure is to provide a substrate processing device and a substrate processing method, by which an internal state of a chamber is adjusted by controlling a gas supply profile, thereby performing uniform processing of a substrate.

According to an aspect of the present disclosure, a substrate processing device includes: a chamber in which a processing space for processing a substrate is formed; a substrate support unit supporting the substrate in the processing space; a gas supply portion supplying process gas to the processing space; a gas supply unit supplying gas to the gas supply portion; and a controller connected to the gas supply unit, wherein the gas supply unit includes a flow control valve controlling a flow rate of the process gas supplied through a gas supply line, and the controller controls, during a first time, the flow control valve to alternately provide supply of a flow rate greater than an average flow rate for the first time and supply of a flow rate less than the average flow rate.

According to another aspect of the present disclosure, a substrate processing method includes: a gas supply operation of supplying process gas to a processing space through one or more gas supply lines; a plasma forming operation of forming plasma in the processing space; and an operation of exhausting an inside of the processing space, wherein the gas supply operation includes: a first gas supply operation of supplying a flow rate less than an average flow rate for a first time, during the first time in which the process gas is supplied through at least one of the gas supply lines, and a second gas supply operation of supplying a flow rate greater than the average flow rate, and the first gas supply operation and the second gas supply operation are performed alternately.

According to another aspect of the present disclosure, a substrate processing device includes: a chamber in which a processing space for processing a substrate is formed; a substrate support unit supporting the substrate in the processing space; a gas supply portion including a shower head supplying process gas to the processing space; a gas supply unit supplying gas to the gas supply portion; a plasma source generating plasma from the process gas supplied to the processing space; a controller connected to the gas supply unit and the plasma source, and an exhaust unit exhausting the processing space, wherein the gas supply unit includes a gas supply line and a flow control valve adjusting a flow rate of the process gas supplied through the gas supply line, the gas supply line includes a first gas supply line connected to the shower head disposed above the substrate and supplying the process gas to a center portion of the substrate and a second gas supply line supplying the process gas to an edge portion of the substrate, the flow control valve includes a first flow control valve disposed in the first gas supply line and a second flow control valve disposed in the second gas supply line, and, when supplying the process gas to the processing space through the first or second gas supply line, the controller controls, during a first time, the flow control valve to alternately provide supply of a flow rate greater than an average flow rate for the first time and supply of a flow rate less than the average flow rate.

BRIEF DESCRIPTION OF DRAWINGS

The above and other aspects, features, and advantages of the present disclosure will be more clearly understood from the following detailed description, taken in conjunction with the accompanying drawings, in which:

FIGS. 7A and 7B are graphs of a gas supply flow rate over time in a substrate processing device, in which FIG. 7A is a graph of a flow rate supplied according to a control method of the related art, and FIG. 7B is a graph of a flow rate supplied according to a method of the present disclosure;

DETAILED DESCRIPTION

Figure 1:
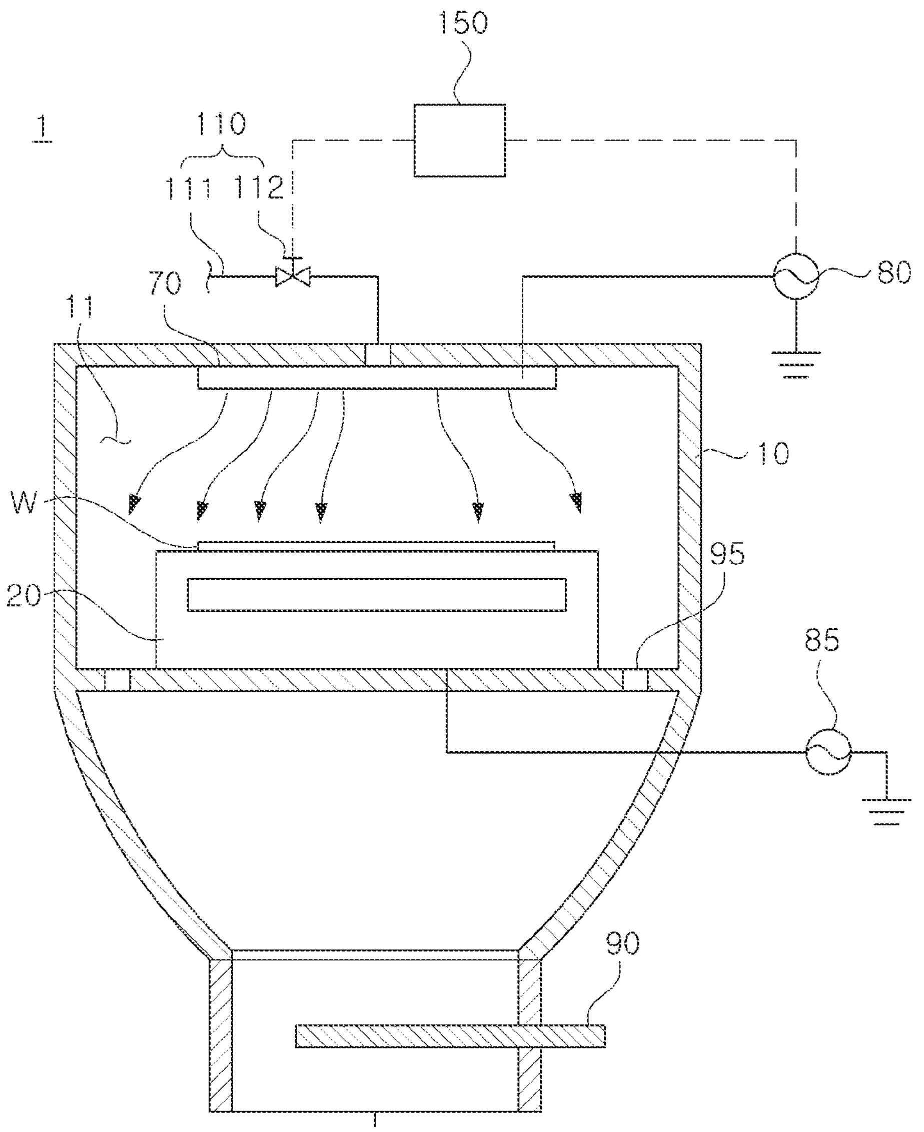
FIG. 1 is a schematic diagram of a substrate processing device according to a first exemplary embodiment of the present disclosure.

Hereinafter, exemplary embodiments will be described in detail with reference to the accompanying drawings such that they may be easily practiced by those skilled in the art to which the present disclosure pertains. In describing the present disclosure, if a detailed explanation for a related known function or construction is considered to unnecessarily divert the gist of the present disclosure, such explanation will be omitted but would be understood by those skilled in the art. Also, similar reference numerals are used for the similar parts throughout the specification.

In this disclosure, terms, such as "above," "upper portion," "upper surface," "below," "lower portion," "lower surface," "lateral surface," and the like, are determined based on the drawings, and in actuality, the terms may be changed according to a direction in which a device or an element is disposed.

It will be understood that when an element is referred to as being "connected to" another element, it may be directly connected to the other element or intervening elements may also be present. In contrast, when an element is referred to as being "directly connected to" another element, no intervening elements are present. In addition, unless explicitly described to the contrary, the word "comprise" and variations, such as "comprises" or "comprising," will be understood to imply the inclusion of stated elements but not the exclusion of any other elements.

The present disclosure may be implemented in many different forms and is not limited to the exemplary embodiments described herein.

FIG. 1 is a schematic diagram of a substrate processing device according to a first exemplary embodiment of the present disclosure.

Referring to FIG. 1, a substrate processing device 1 according to an exemplary embodiment of the present disclosure includes a chamber 10 forming a processing space 11, a substrate support unit 20, a gas supply portion 70, the gas supply unit 110 supplying gas to the gas supply portion 70, a baffle 95, an opening/closing valve 90 provided in an exhaust port, and a controller 150.

The chamber 10 may have the sealed processing space 11 in which a substrate is processed. An inner wall of the chamber 10 may be coated with a material preventing etching by neutral gas (radical), plasma, or etchant. For example, the chamber 10 may be formed of aluminum.

The substrate support unit 20 supporting a substrate W is disposed on a lower side within the chamber 10. The substrate support unit 20 may be disposed in the internal space of the chamber 10 to support the substrate W. The substrate support unit 20 may have a heater therein to heat the substrate to a temperature suitable for a process. In addition, RF power 85 may be applied to the substrate support unit 20 to serve as a lower electrode. The RF power source 80 is also connected to the gas supply portion 70 and may serve as an upper electrode.

The upper and lower electrodes may be arranged up and down in parallel, one of the two electrodes may apply high-frequency power and the other electrode may be grounded, and an electromagnetic field may be formed in the processing space 11 between the two electrodes, and gas supplied to the processing space 11 may be excited into a plasma state. The upper and lower electrodes may be referred to as plasma sources. The present disclosure uses inductively coupled plasma (ICP plasma), but is not limited thereto and another type of plasma source, for example, capacitively coupled plasma (CCP plasma) may also be applied, as long as it is a plasma source that excites supply gas into a plasma state.

The gas supply portion 70 is disposed on an upper side of the chamber 10 and discharges the process gas supplied from the gas supply unit 110 into the processing space 11. The gas supply portion 70 may include a shower head and is disposed above the substrate support unit 20.

The gas supply unit 110 includes a gas supply line 111 connected to a gas supply source (not illustrated) and a flow control valve 112 disposed on the gas supply line 111. The flow control valve 112 may operate in a manner of adjusting the degree of opening of a flow path inside the flow control valve 112 through a driving unit.

The flow control valve 112 of the gas supply unit 110 is connected to the controller 150 together with the RF power sources 80 and 85. The controller 150 controls the substrate processing device 1.

Figure 2A:
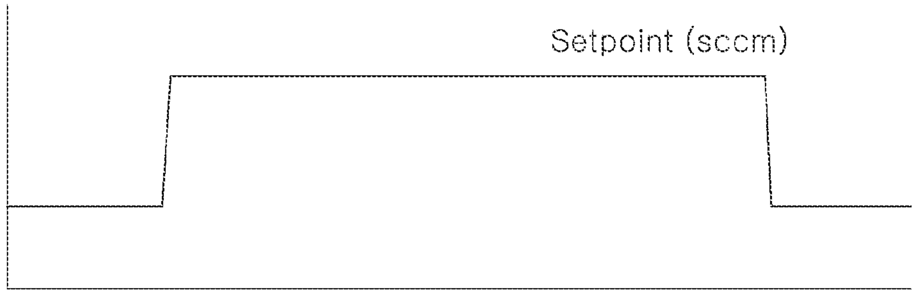
FIGS. 2A-2C are schematic diagrams of an operation of a flow control valve of the related art.
Figure 2B:
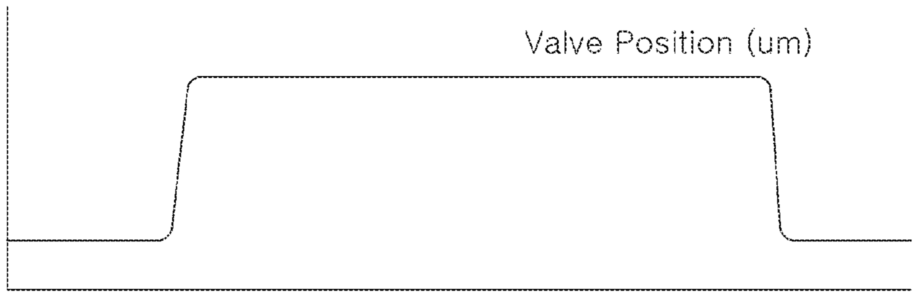
Figure 2C:
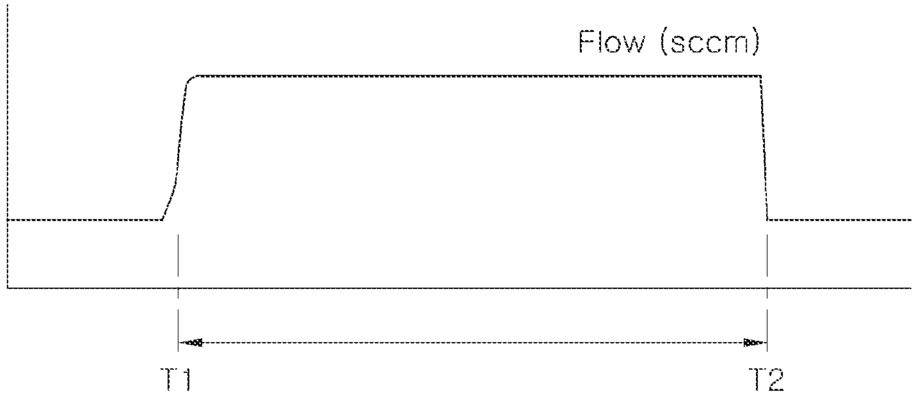

FIGS. 2A-2C illustrates a method of supplying gas through the flow control valve 112 of the gas supply unit 110.

As illustrated in FIGS. 2A-2C, in the related art, when process gas is supplied through the flow control valve 112 of the gas supply unit 110, the controller 150 adjusts a setpoint of the driving unit of the flow control valve 112 as illustrated in FIG. 2A, and accordingly, a valve position of the flow control valve 112 is adjusted as illustrated in FIG. 2B, and as a result, flow rate is adjusted as illustrated in FIG. 2C. In the related art, once a target flow rate was determined, a setpoint was set to match the flow rate and a flow rate was supplied.

Figure 3A:
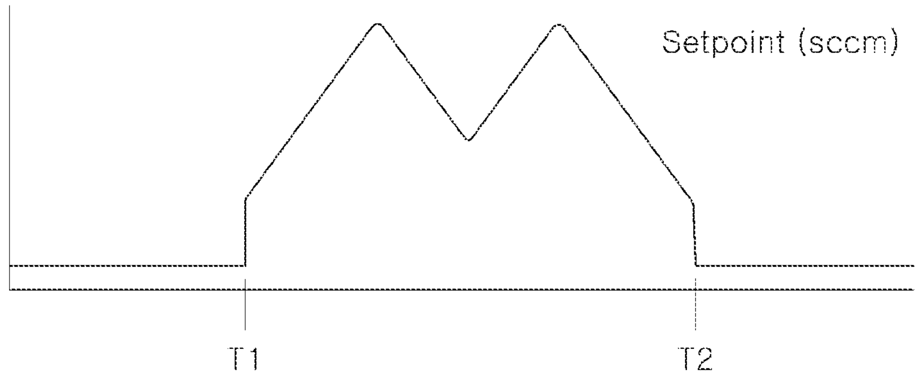
FIGS. 3A-3C are schematic diagrams of an operation of a flow control valve of the present disclosure.
Figure 3B:
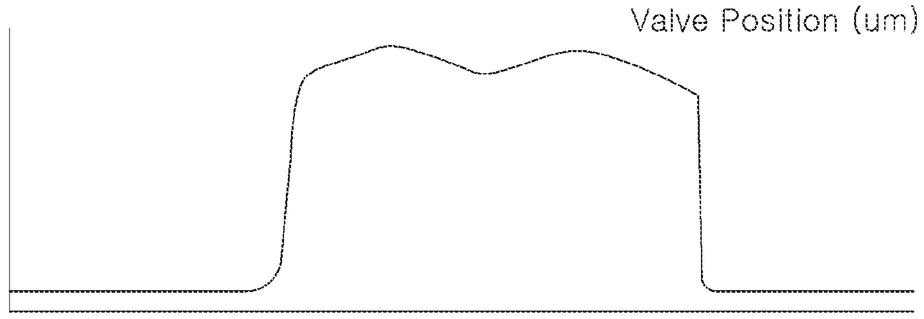
Figure 3C:
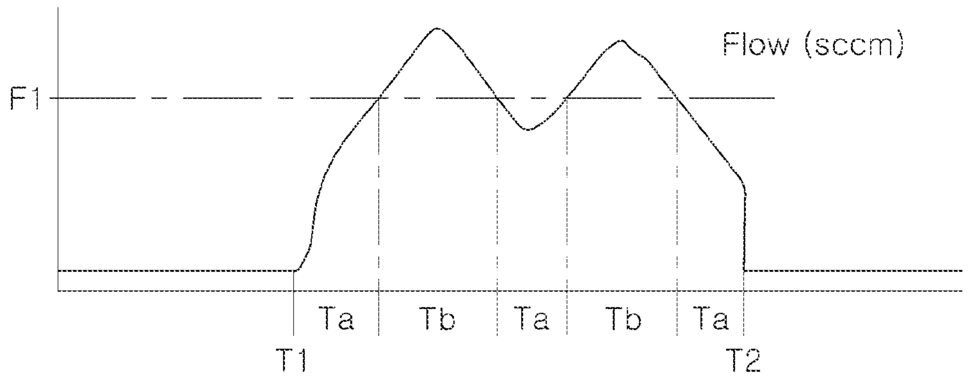

In an exemplary embodiment of the present disclosure, the controller 150 changes the setpoint of the flow control valve 112 to be different from the existing one. FIGS. 3A-3C illustrate schematic diagrams of an operation of a flow control valve according to an exemplary embodiment of the present disclosure. As illustrated in FIGS. 3A-3C, in an exemplary embodiment, the controller 150 changes the setpoint of the flow control valve 112, and a valve position is changed accordingly to adjust a flow rate. In an exemplary embodiment, the controller 150 supplies the process gas by varying a first section Ta, which is smaller than an average flow rate, and a second section Tb, which is greater than the average flow rate, while maintaining the average flow rate to be the same as a target flow rate.

Specifically, in the case of supplying the process gas during a first time from time T1 to time T2 through the flow control valve 112, the average flow rate F1 is matched to the target flow rate, and while the amount of process gas supplied during the first time is maintained, the process gas is supplied to be lower than the average flow rate F1 in the first section Ta and to be higher than the average flow rage F1 in the second section Tb, and the first section Ta and the second section Tb are alternately performed. The first section Ta and the second section Tb may be changed continuously, for example, in a sine wave manner. Here, the sine wave is not a sine wave in the mathematical sense, but means that the first section Ta and the second section Tb continuously change and fluctuate around the average flow rate F1, as illustrated in FIG. 3C.

The controller 150 adjust a supply method of the process gas supplied to the processing space 11 of the chamber 10 by controlling the flow control valve 112 of the gas supply unit 110. In the present disclosure, the process gas is not supplied by a constant amount to the processing space 11 but changes, thereby achieving an even etching rate with respect to the center, the middle and the edge of the substrate W.

Figure 4:
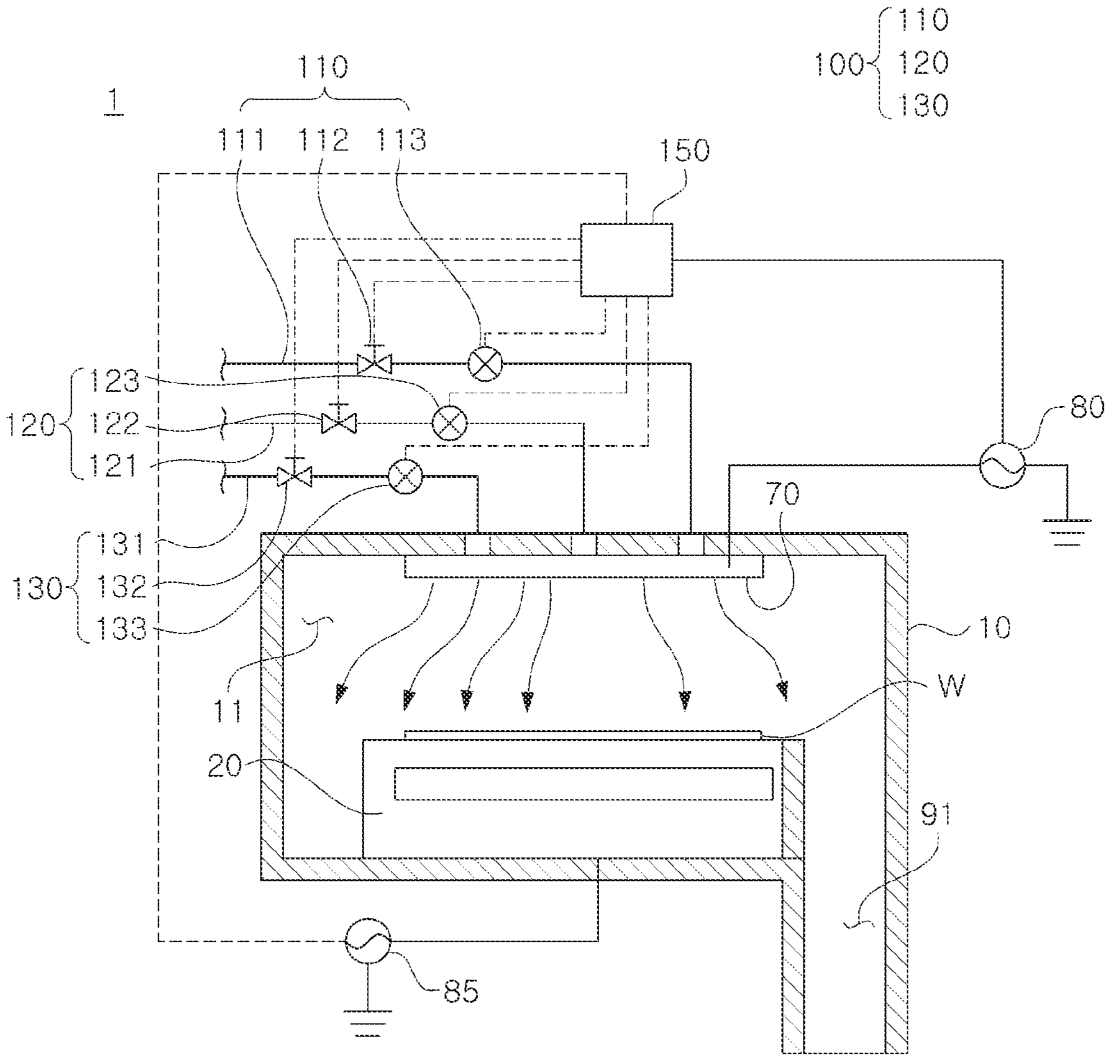
FIG. 4 is a schematic diagram of a substrate processing device according to a second exemplary embodiment of the present disclosure.
Figure 5:
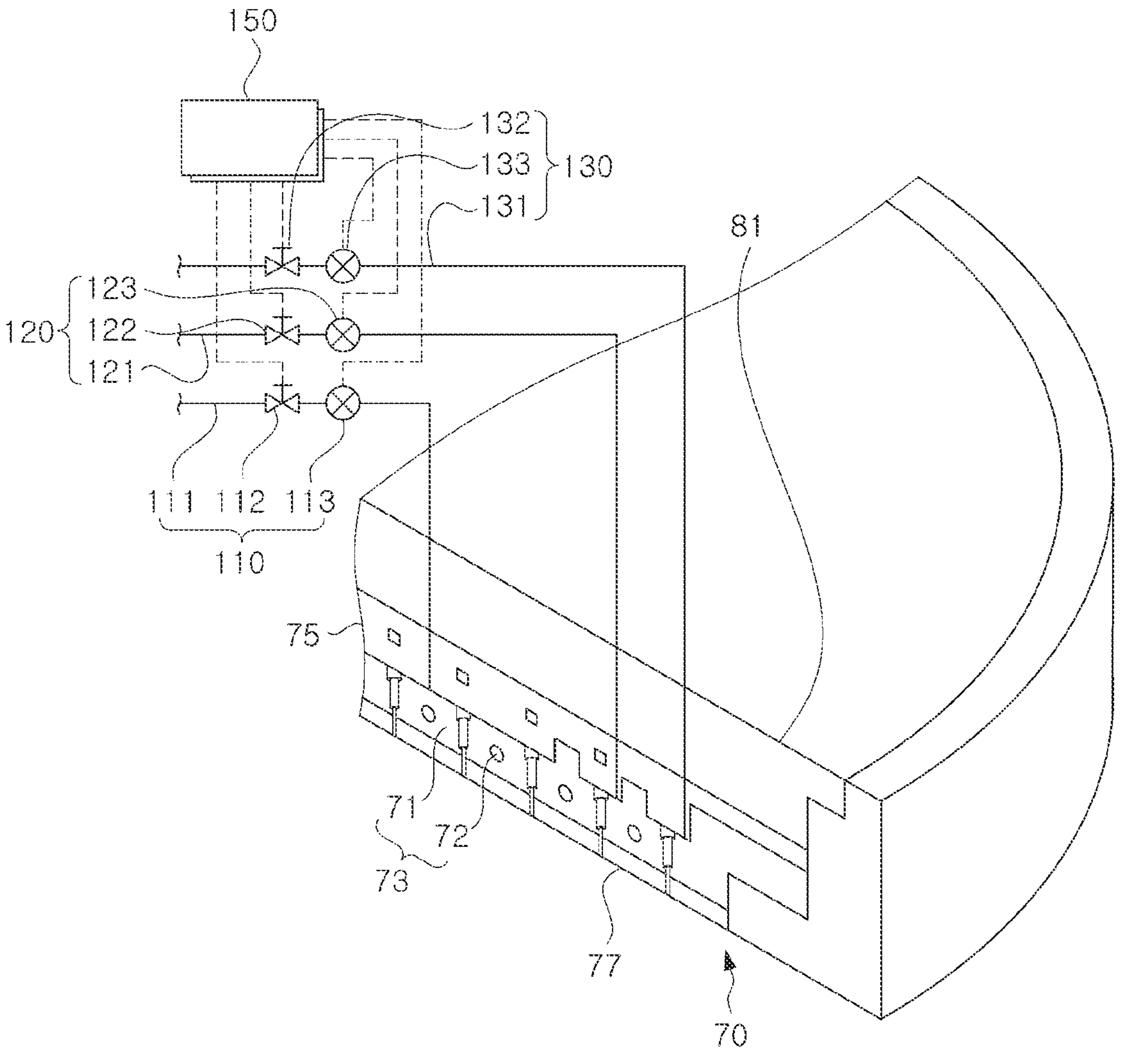
FIG. 5 is a schematic diagram of a gas supply unit of a substrate processing device according to the second exemplary embodiment of the present disclosure.
Figure 6:
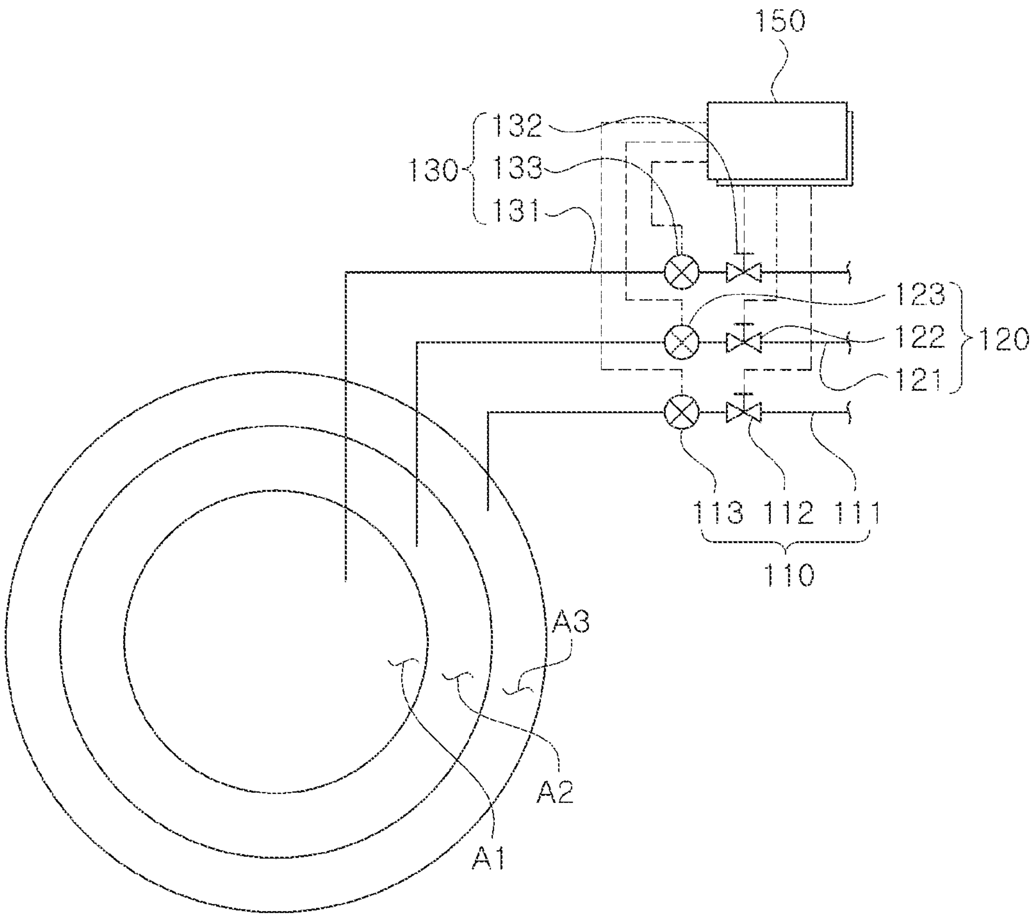
FIG. 6 is a plan schematic diagram of a substrate processing device according to the second exemplary embodiment of the present disclosure.

FIG. 4 illustrates a schematic diagram of a substrate processing device according to a second exemplary embodiment of the present disclosure, FIG. 5 illustrates a schematic diagram of a gas supply unit of a substrate processing device according to the second exemplary embodiment of the present disclosure, and FIG. 6 illustrates a plan schematic diagram of a substrate processing device according to the second exemplary embodiment of the present disclosure.

In the second exemplary embodiment, as in the first exemplary embodiment of FIG. 1, the substrate processing device 1 includes the chamber 10 forming the processing space 11, the substrate support unit 20, the gas supply portion 70, gas supply units 110, 120, and 130 supplying gas to the gas supply portion 70, an exhaust port 91, and the controller 150. However, in the second exemplary embodiment, the gas supply portion 70 is divided into a plurality of regions, and the gas supply units 110, 120, and 130 include first to third gas supply units 110, 120, and 130 respectively corresponding to the regions.

The chamber 10 has the sealed processing space 11 in which a substrate is processed, and the substrate support unit 20 supporting the substrate W is disposed on a lower side within the chamber 10. The substrate support unit 20 is disposed in an internal space of the chamber 10 and supports the substrate W. The substrate support unit 20 may have a heater therein to heat the substrate to a temperature suitable for the process. In addition, RF power 85 may be applied to the substrate support unit 20 to serve as a lower electrode.

The gas supply portion 70 is disposed on an upper side of the chamber 10 and discharges the process gas supplied from the gas supply unit 110 into the processing space 11. The gas supply portion 70 may be a shower head and is disposed above the substrate support unit 20. As illustrated in FIG. 5, the gas supply portion 70 includes an upper electrode 81, a distribution plate 75 disposed below the upper electrode 81, a heating plate 73 below the distribution plate 75, and a lower shower plate 77 below the heating plate 73.

As illustrated in FIG. 6, the distribution plate 75 is divided into first, second, and third regions A1, A2, and A3 corresponding to the center portion, middle portion, and edge portion of the substrate W, and the first to third gas supply units 110, 120, and 130 are connected to the first to third regions A1, A2, and A3, respectively.

The heating plate 73 includes a heater 72 heating the supplied process gas to a required temperature and a lower plate 71. The process gas distributed by the distribution plate 75 is heated while passing through the heating plate 73 and is supplied to the processing space 11 through the shower plate 77.

The first gas supply unit 110 includes a first gas supply line 111 connected to a gas supply source (not illustrated), a first flow control valve 112 disposed on the first gas supply line 111, and a first flow measurement member 113 disposed behind the first flow control valve 112. Similarly, the second gas supply unit 120 and the third gas supply unit 130 include second and third gas supply lines 121 and 131, second and third flow control valves 122 and 132, and second and third flow measurement members 123 and 133, respectively, like the first gas supply unit 110.

The controller 150 is connected to each of the first to third flow control valves 112, 122, and 132 and the first to third flow measurement members 113, 123, and 133, adjusts the supply amount of the process gas supplied to each region A1, A2, and A3 through the first to third flow control valves 112, 122, and 132, and measures the adjusted supply amount by the first to third flow measurement members 113, 123, and 133 to confirm and feedback control whether the supply amount is accurately adjusted.

The controller 150 may independently control the first to third gas supply units 110, 120, and 130, and the first to third gas supply lines 111, 121, and 131 of the first to third gas supply units 110, 120, and 130 may be connected to the same gas source, but may also be connected to different gas sources.

The exhaust port 91 may be provided in a lower portion of one side of the substrate support unit 20, and although not illustrated, an exhaust valve may be provided inside the exhaust port 91. After processing the substrate W, the process gas in the processing space 11 may be exhausted through the exhaust port 91. It is also possible for the exhaust-related component to be configured in the same manner as that of the first exemplary embodiment.

In the second exemplary embodiment, the controller 150 may supply the gas to the processing space 11 through the flow control valves 112, 122, and 132, while changing the amount of the gas, as in the first exemplary embodiment. In the second exemplary embodiment, the controller 150 supplies the process gas, while changing a flow rate through the flow control valves 112, 122, and 132 of the at least one gas supply unit 110, 120, and 130, and supplies the process gas, while changing a flow rate of the process gas through all flow control valves 112, 122, and 132 as necessary.

The controller 150 may adjust the flow rate of the process gas supplied to the edge portion by the third flow control valve 133 of the third gas supply unit 130 connected to the third region A3 corresponding to at least the edge portion of the substrate W, but the present disclosure is not limited thereto.

Figure 7A:
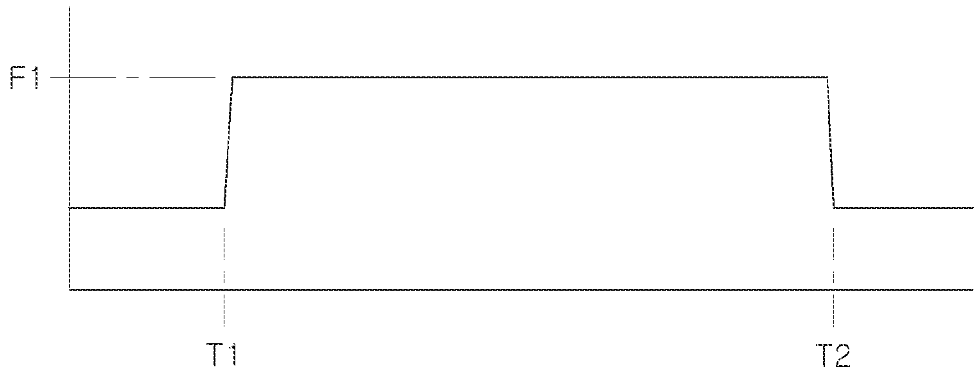
Figure 7B:
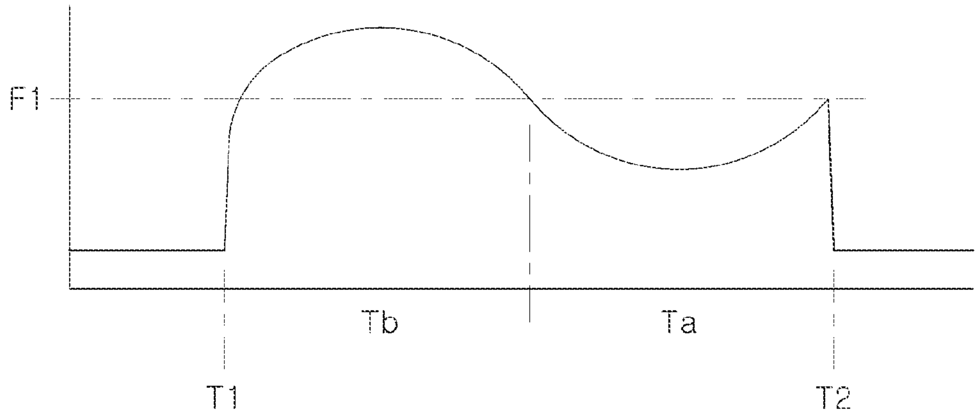

FIGS. 7A and 7B illustrate graphs of gas supply flow rate over time in a substrate processing device. Specifically, FIG. 7A is a graph of a flow rate supplied according to a control method of the related art, and FIG. 7B is a graph of a flow rate supplied according to a method of the present disclosure, FIG. 8 is a graph of an etching rate of a substrate measured after supplying gas according to the gas supply flow rate of FIGS. 7A and 7B, FIGS. 9A and 9B are images of an etching amount of a substrate after supplying gas according to the gas supply flow rate of FIGS. 7A and 7B in which FIG. 9A illustrates an image after supplying gas according to the control method of the related art, and FIG. 9B illustrates an image after supplying gas according to the method of the present disclosure.

The control method of the related art is to supply process gas in a constant amount once a target flow rate or target supply amount is set, and the method of the present disclosure is to supply process gas by alternating the first section Ta having a flow rate lower than the average flow rate F1 and the second section Tb having a flow rate higher than the average flow rate F1 during a supply time based on the average flow rate F1 during the supply time. One of the first section Ta and the second section Tb is performed first, and then the other is performed. A period during which the first section Ta and the second section Tb change may be equal to or smaller than the supply time.

Figure 8:
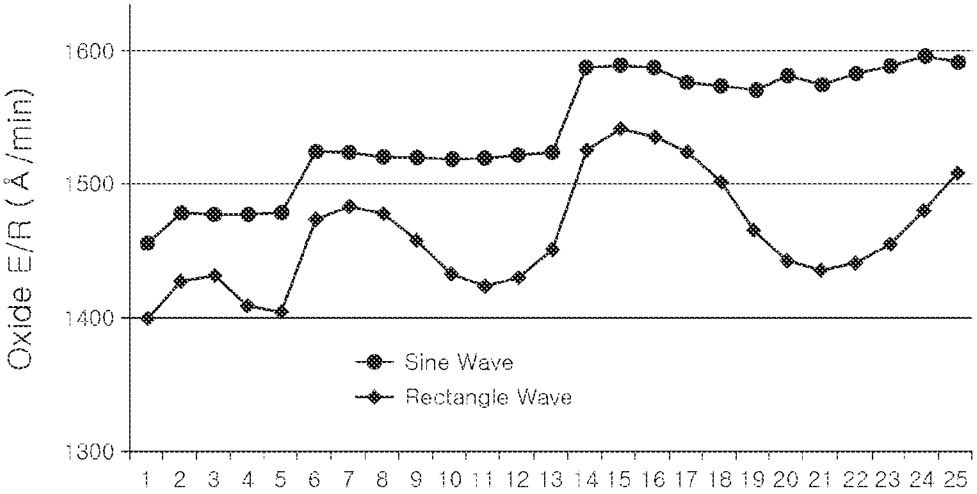
FIG. 8 is a graph of an etching rate of a substrate measured after supplying gas according to the gas supply flow rate of FIGS. 7A and 7B.
Figure 9A:
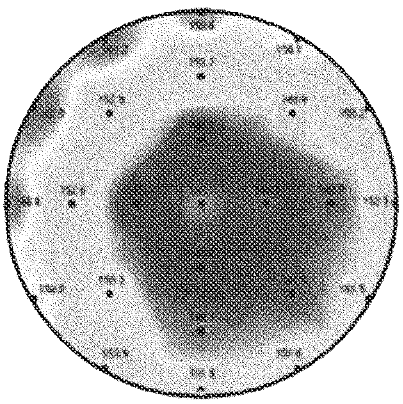
FIGS. 9A and 9B are images of an etching amount of a substrate after supplying gas according to the gas supply flow rate of FIGS. 7A and 7B.
Figure 9B:
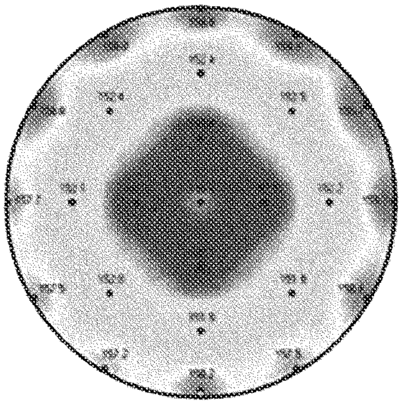

In the substrate processing device 1 illustrated in FIG. 5, results of measuring an etching rate of the etched substrate W, while the controller 150 controlled the flow control valves 112, 122, and 132 according to the control method of the related art, and results of measuring an etch rage of the etched substrate W, while the controller 150 controlled the flow control valves 112, 122, and 132 according to the control method of the present disclosure in the same substrate processing device are illustrated in FIGS. 8 and 9.

In FIG. 8, the X axis represents a measurement position in the substrate W, 1 to 5 correspond to the center portion of the substrate W, 6 to 13 correspond to the middle portion of the substrate W, and 14 to 25 correspond to the edge portion of the substrate W. Each number is assigned in a circumferential direction in each position, and the measurement points are indicated in FIGS. 9A and 9B.

As illustrated in FIGS. 8, 9A and 9B, when the flow control valves 112, 122, and 132 were controlled according to the control method of the related art, the etching rates changed depending on the circumferential position in each region, but in the case of controlling the flow control valves 112, 122, and 132 according to the control method of the present disclosure, a constant etching rate was achieved in each region without changes depending on the circumferential position. In other words, when the process gas was supplied while controlling the profile with a sine wave, there was no change in the etching rate depending on the circumferential position. Therefore, by adjusting the process gas supply profile through the controller 150, the etching rate for each region may be made uniform, and in particular, even a portion that cannot be used due to the etching rate that varies significantly in the edge portion may also be used by control according to the present disclosure, thereby improving the yield of the substrate W.

Figure 10:
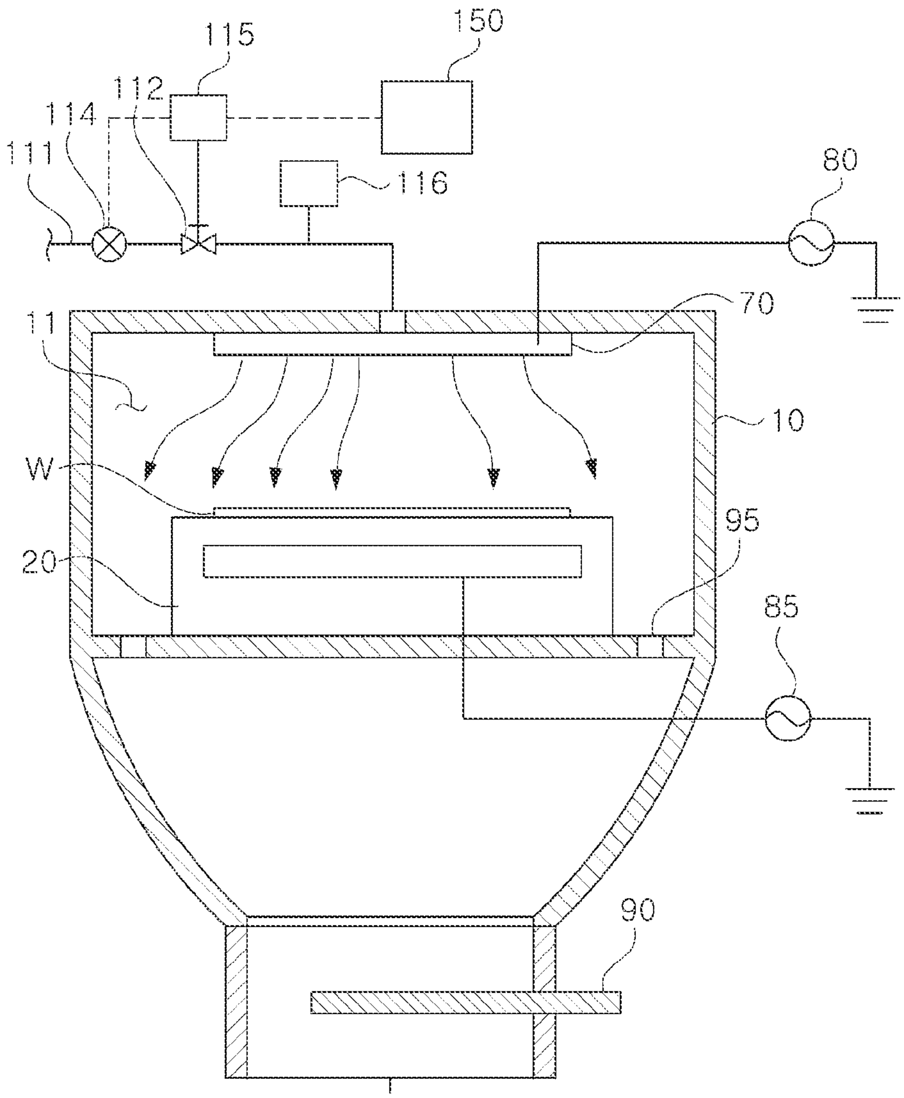
FIG. 10 is a schematic diagram of a substrate processing device according to a third exemplary embodiment of the present disclosure.

FIG. 10 illustrates a third exemplary embodiment of the present disclosure.

In the case of the third exemplary embodiment, an overall configuration is similar to the first exemplary embodiment of FIG. 1, and only the configuration of the gas supply unit 110 is different, so the description will focus only on the gas supply unit 110, and the descriptions on other components will be replaced with the description of the first exemplary embodiment.

In the third exemplary embodiment, the gas supply unit 110 includes a gas supply line 111, a flow control valve 112, a sensor 114 disposed upstream of the flow control valve 112, a position controller 115 connected to the flow control valve 112, and a calibration device 116 disposed downstream of flow control valve 112.

The sensor 114 may be a pressure sensor or a temperature sensor, and measures pressure or temperature of the supplied process gas and provides the measured pressure or temperature to the position controller 115. The position controller 115 is connected to the controller 150 and adjusts the flow control valve 112 so that a specific flow rate passes at a specific setpoint, upon receiving a signal from the controller 150. The present exemplary embodiment includes the calibration device 116, which may be a flow verifier or a mass flow meter measuring a passing flow rate and determine whether the position controller 115 has accurately controlled to adjust the relationship between the setpoint and the flow rate.

Through the configuration, the gas supply unit 110 may accurately control the flow rate, and by changing the supply flow rate of the supply gas at regular intervals, a difference in etching rate depending on the circumferential position may be reduced.

Figure 11:
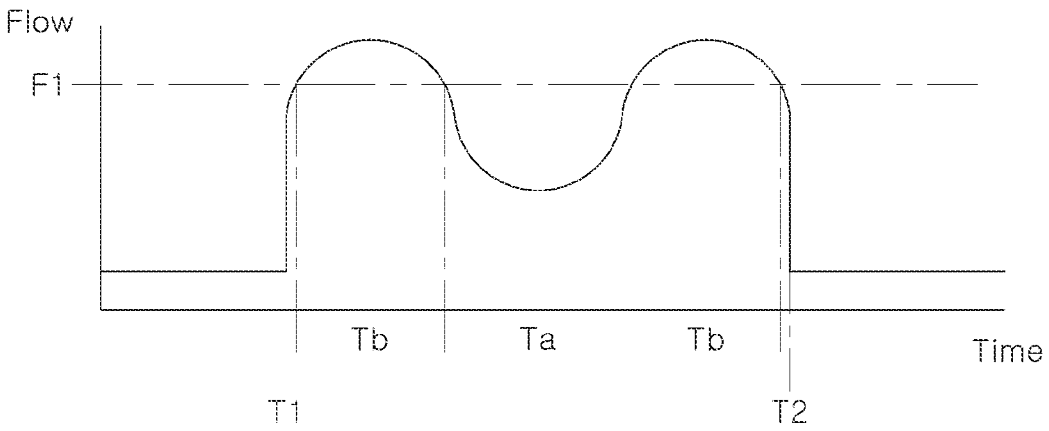
FIGS. 11 and 12 are graphs illustrating a profile of a gas supply flow rate in a substrate processing device of the present disclosure.
Figure 12:
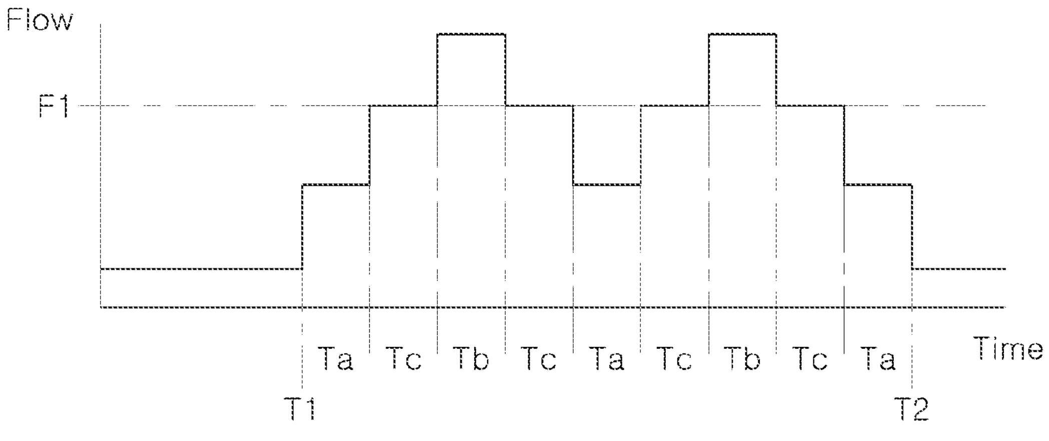

Meanwhile, FIGS. 11 and 12 illustrate graphs of a profile of the gas supply flow rate in the substrate processing device of the present disclosure.

As illustrated in FIG. 11, when the supply gas is supplied during a first time T2 to T1, it is sufficient to supply the supply gas at least one cycle, and the first time T2 to T1 does not have to be a multiple of the period of the profile. That is, in the present disclosure, the number of first sections Ta and second sections Tb in the gas supply profile does not have to be the same, and it is sufficient for the first section Ta and the second section Tb to alternate. For reference, the first section Ta, which is lower than the average flow rate F1, does not block the gas supply.

As illustrated in FIG. 12, a third section Tc in which gas is supplied at the average flow rate may be provided between the first section Ta and the second section Tb, and it is also possible that the flow rate does not change gradually but remains constant in the first section Ta, the second section Tb, and the third section Tc.

Figure 13:
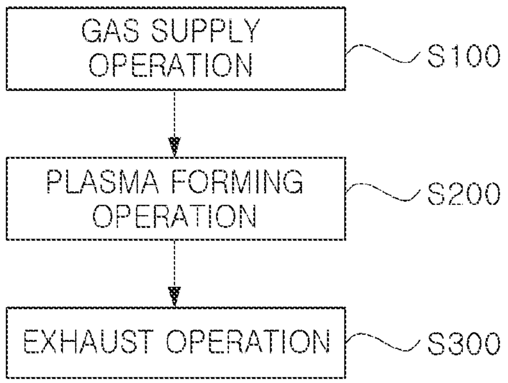
FIG. 13 is a schematic diagram of a substrate processing method according to an exemplary embodiment of the present disclosure.
Figure 14:
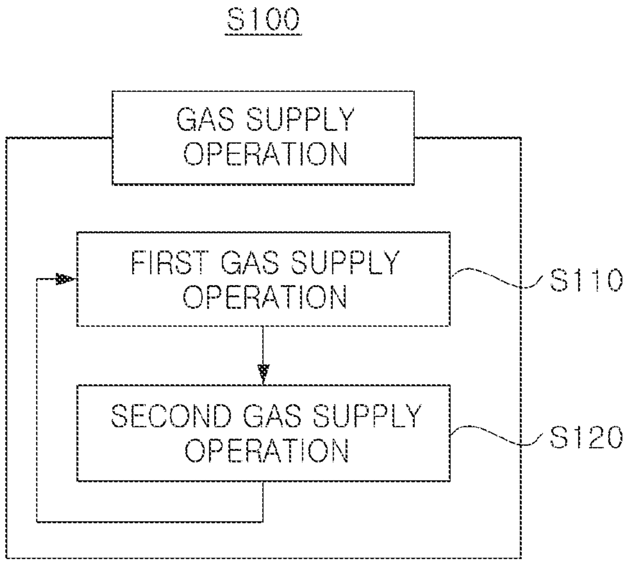
FIG. 14 is a schematic diagram of a gas supply operation of the substrate processing method of FIG. 13.

FIG. 13 illustrates a flowchart of a substrate processing method according to an exemplary embodiment of the present disclosure, and FIG. 14 illustrates a flowchart of a gas supply operation (S100) of the substrate processing method of FIG. 13.

A substrate processing method according to an exemplary embodiment of the present disclosure includes a gas supply operation (S100) of supplying a process gas to a processing space through one or more gas supply lines; a plasma forming operation (S200) of forming plasma in the processing space; and an operation (S300) of exhausting the inside of the processing space (S300).

The gas supply operation (S100) may include a first gas supply operation (S110) of supplying a flow rate less than the average flow rate F1 during a first time during which the gas supply operation is performed, and a second gas supply operation (S120) of supplying a flow rate greater than the average flow rate, and the first gas supply operation (S110) and the second gas supply operation (S120) may be performed alternately.

The first gas supply operation (S110) and the second gas supply operation (S120) may be performed alternately at regular intervals, and the supply flow rates in the first gas supply operation (S110) and the second gas supply operation (S120) may change continuously.

The first gas supply operation (S110) may supply gas at a flow rate of 0.5 times or more than the average flow rate F1, and the second gas supply operation (S120) supplies gas at a flow rate of 1.5 times or less than the average flow rate F1. It may be difficult to control the flow rate out of the range, and it may also be difficult to achieve a uniform etching rate if the flow rate is out of the range. At this time, it is preferable that a difference between the flow rates in the first gas supply operation (S110) and the second gas supply operation (S120) and the average flow rate F1 does not exceed a maximum of 1000 sccm (standard cc per minute.

In the gas supply operation (S100), one of the first gas supply operation (S110) and the second gas supply operation (S120) is performed first, followed by the other operation. It is also possible to perform a third gas supply operation in which gas is supplied at a flow rate of the average flow rate F1 midway. The first gas supply operation (S110) and the second gas supply operation (S120) may be performed in the form of sine waves symmetrical based on a point at which the first and second gas supply operations (S110 and S120) intersect on the flow rate graph over time.

The substrate processing method of the present disclosure includes a method of etching a substrate, and the process gas may include an etching gas.

The present disclosure may provide a substrate processing device and a substrate processing method that may perform uniform processing of substrates by adjusting the internal state of the chamber by controlling the gas supply profile through the above configuration.

While example exemplary embodiments have been illustrated and described above, it will be apparent to those skilled in the art that modifications and variations could be made without departing from the scope of the present disclosure as defined by the appended claims.

What is claimed is:

1. A substrate processing method comprising:

a gas supply operation of supplying process gas to a processing space through one or more gas supply lines;

a plasma forming operation of forming plasma in the processing space; and an operation of exhausting an inside of the processing space, wherein the gas supply operation includes:

a first gas supply operation of supplying a flow rate less than an average flow rate for a first time, during the first time in which the process gas is supplied through at least one of the gas supply lines, and a second gas supply operation of supplying a flow rate greater than the average flow rate, and the first gas supply operation and the second gas supply operation are performed alternately, wherein the gas supply line includes a first gas supply line providing gas to a center portion of the substrate and a second gas supply line providing gas to an edge portion of the substrate, and wherein the first gas supply line and the second gas supply line supply process gas to respectively different periodic waveform profiles including sinusoidal waveforms.

2. The substrate processing method of claim 1, wherein, in at least one of the first and second gas supply operations, a supply amount of the process gas is continuously changed.

3. The substrate processing method of claim 1, wherein, in the gas supply operation, a supply flow rate of the process gas changes periodically during the first time.

4. The substrate processing method of claim 3, wherein, in the gas supply operation, the flow rate is adjusted by a flow control valve disposed in the gas supply line, and the supply flow rate of the process gas is supplied, while changing in a sine wave form.

5. The substrate processing method of claim 1, wherein, in the gas supply operation, a maximum flow rate is 1.5 times the average flow rate or less, and a minimum flow rate is 0.5 times the average flow rate or more during the first time.

6. The substrate processing method of claim 5, wherein a difference between the maximum flow rate and the average flow rate is equal to a difference between the average flow rate and the minimum flow rate, and the difference between the maximum flow rate and the average flow rate is 1000 sccm or less.

7. The substrate processing method of claim 1, wherein the gas supply operation includes the first gas supply operation of supplying a flow rate greater than the average flow rate and the second gas supply operation of supplying a flow rate less than the average flow rate, and in a flow rate graph over time, the first gas supply operation and the second gas supply operation are symmetrical based on a point at which the first and second gas supply operations intersect.

8. The substrate processing method of claim 1, wherein the process gas includes an etching gas.

* * * * *